(12) United States Patent
Shirasaki

(10) Patent No.: US 8,426,083 B2
(45) Date of Patent: Apr. 23, 2013

(54) PELLICLE FOR LITHOGRAPHY

(75) Inventor: Toru Shirasaki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 178 days.

(21) Appl. No.: 12/929,554

(22) Filed: Feb. 1, 2011

(65) Prior Publication Data

US 2011/0195350 A1    Aug. 11, 2011

(30) Foreign Application Priority Data

Feb. 8, 2010   (JP) .................................. 2010-025323

(51) Int. Cl.
*G03F 1/62*   (2012.01)
*G03F 1/64*   (2012.01)

(52) U.S. Cl.
USPC ............................................................ 430/5

(58) Field of Classification Search ........ 430/5; 428/14; 156/556
See application file for complete search history.

(56) References Cited

U.S. PATENT DOCUMENTS

2009/0073415 A1 *  3/2009  Lee et al. ........................ 355/75

\* cited by examiner

*Primary Examiner* — Stephen Rosasco
(74) *Attorney, Agent, or Firm* — Manabu Kanesaka

(57) ABSTRACT

There is provided a pellicle in which the adhesive layer bearing the pellicle membrane is molded so flatly that the flatness of the pellicle as measured across the membrane is 10 micrometers or smaller, and this is preferably accompanied by an improved flatness of mask-bonding adhesive layer (agglutinant layer), which can be 15 micrometers to 10 micrometers or even smaller.

4 Claims, 1 Drawing Sheet

PELLICLE FOR LITHOGRAPHY

The present application claims priority from Japanese Application No. 2010-025323 filed on Feb. 8, 2010, the disclosure of which is hereby incorporated by reference herein in its entirety.

FIELD OF THE INVENTION

The present invention relates to a pellicle for lithography, in particular to a pellicle for lithography used as dust-proof protection in the manufacture of semiconductor devices such as LSI's and ultra-LSI's or the like.

BACKGROUND OF THE INVENTION

Conventionally, the manufacture of semiconductor devices such as LSI and ultra LSI devices, or liquid crystal display panels and the like, involves patterning of semiconductor wafers or liquid crystal base plates through irradiation of light upon them.

However, a problem exists in that any dust particles adhering to the exposure original plate (photomask) used in such cases absorb and reflect light, which deforms and roughens the edge lines of the transferred patterning, thereby impairing the dimensions, quality, appearance and performance of the semiconductor device and/or liquid crystal display panel, while reducing the manufacturing yield thereof.

Thus, these procedures are usually carried out in a clean room; but keeping the photomask always in good conditions even within such a clean environment is difficult, and hence a pellicle with a membrane having good transmittance to the exposure lights is mounted on the surface of the photomask, for dust-proof protection. Doing so is advantageous in that the dust particles are not deposited directly onto the surface of the photomask, but become deposited onto the pellicle membrane, so that during photolithography the dust particles on the pellicle membrane do not affect image transfer, since the photo focus is set on the pattern formed on the photomask.

A pellicle is built up of a pellicle frame, which is made of aluminum or a stainless steel or polyethylene or the like, and a transparent pellicle membrane made of cellulose nitrate or cellulose acetate or the like, which transmits light well; this membrane is attached to one of the two frame faces (hereinafter referred to as "membrane-receiving frame face" or "membrane-bearing frame face") after laying a solvent capable of dissolving the pellicle membrane on the membrane-receiving frame face and drying the solvent by air flow (ref. Publication-in-patent 1), or after laying an adhesive such as acrylic resin and epoxy resin (ref. Publications-in-patent 2, 3 and 4); furthermore, on the other one of the two frame faces (hereinafter referred to as "mask-side frame face") is laid an adhesive layer made of a polybutene resin, a polyvinyl acetate resin, an acrylic resin, a silicone resin or the like, and over this adhesive layer (hereinafter also referred to as "agglutinant layer" to distinguish it from the adhesive layer for bonding the membrane, though there may be cases where these two layers are made of an identical adhesive material) is laid a releasable liner (separator) for protecting the agglutinant layer.

In recent years, the requirement for the resolution of lithography has become heightened gradually, and in order to attain such higher resolutions the light sources having shorter and shorter wavelengths have come to be adopted. In practice, ultraviolet lights [g-line (436 nm), I-line (365 nm), KrF excimer lasers (248 nm)] are newly employed, and more recently ArF excimer lasers (193 nm) have begun to be used.

As the wavelengths of the exposure lights are shifted toward shorter lengths, a new problem has arisen wherein a deformation of the lithographic image is caused by the deformation of the exposure original plate (mask).

It has been pointed out that one of the causes for the deformation or in-plane distortion of the exposure original plate is the less admirable flatness of the pellicle which is attached to the exposure original plate. The inventor hereof previously presented a proposal for controlling the pellicle-induced distortions of mask by means of an improvement in the flatness of the mask-bonding adhesive layer, i.e., the agglutinant layer (ref. Publication-in-patent 5).

In this Publication-in-patent 5, it is proposed to make flatter the surface of the agglutinant layer laid on the mask-side frame face of the pellicle frame by pressing the pellicle frame on a flat plate having a high flatness by the weight of the pellicle frame itself.

That invention certainly improved the maintenance of the high flatness of the mask greatly; however, there have still been occasional incidents observed wherein the transferred light image was deformed, especially in the cases wherein the masks are exposed to lights of shorter wavelengths. The cause for this deformation was looked for and it was found that the flatness level of the membrane-side surface of the pellicle, which had been thought irrelevant, had a subtle relevancy.

Thus, when the pellicle is being attached to the mask, the membrane-side surface of the pellicle is touched by a pressure plate of a pellicle mounter, and on this occasion, if the membrane-bonding adhesive layer has an unevenness in its surface, the convex parts are pressed with greater forces than concaved parts are. If the (mask-side) surface of the agglutinant layer is finished sufficiently flat, the pellicle frame itself does not suffer any substantial deformation even at the thicker localities of the membrane-bonding adhesive layer, thanks to the relatively high rigidity of the pellicle frame as a whole, but the pressure that comes by way of the pellicle frame either causes the side faces of the agglutinant layer to bulge and thereby get in contact with the mask, or causes more compressive residual stress to build up at such localities of the agglutinant layer.

When the pressure plate is removed from the pellicle and the imposition of the pressure is let up, the agglutinant layer freed from the pressure starts trying to regain its former shape. Owing to the sizable adhesive strength and resiliency of the adhesive constituting the agglutinant layer, that portions of the agglutinant layer which are bulging from the side faces of the agglutinant layer are liable to remain affixed to the mask surface wherefore the agglutinant layer as it recovers its former shape pulls the mask surface, or those portions of the agglutinant layer where more compressive residual stress is built up are inclined to expand the mask, wherefore the in-plane distortions of mask occur as the pellicle is bonded on the mask.

LIST OF PRIOR ART PUBLICATIONS

Publications-In-patent

[Publication-in-patent 1] Japanese Published Patent Application S58-219023
[Publication-in-patent 2] U.S. Pat. No. 4,861,402
[Publication-in-patent 3] Japanese Pre-Patent Publication for Public Review S63-27707
[Publication-in-patent 4] Japanese Published Patent Application H07-168345

[Publication-in-patent 5] Japanese Published Patent Application 2009-25560

SUMMARY OF THE INVENTION

Problems the Invention Seeks to Solve

In view of the above-mentioned circumstances, it is an object of the present invention to propose a pellicle for lithography which imparts little deformation to the mask as the former is bonded on the latter.

Means to Solve the Problems

The present invention has its basic concept in that the flatness of the membrane-bonding adhesive layer is made higher than the conventional pellicles.

In other words, the pellicle for lithography according to the present invention is a pellicle wherein a membrane-bonding adhesive is applied to one of the two frame faces across which a pellicle membrane is tensely bonded, and a mask-bonding agglutinant layer is tensely bonded on the other frame face, and the improvement of the invention lies in that the flatness of that face of the membrane-bonding adhesive layer which is opposite to the face thereof in contact with the pellicle frame is 10 micrometers or smaller. Considering the highness of the flatness of the pellicle membrane itself, which is in the level of 0.001 micrometer, the present invention can be defined as a pellicle wherein the flatness of the membrane-side surface of the pellicle is 10 micrometers or smaller.

Result of the Invention

The pellicle for lithography according to the present invention is advantageous in that, when the pellicle is bonded on the mask by means of a pressure plate which pushes the pellicle frame, the agglutinant layer receives the pressure more evenly across its entire length for the reason that the membrane-bonding adhesive layer has an improved flatness, and as the result the deformation of the agglutinant layer and building up of the compressive residual stress in the agglutinant layer are withheld and thus the mask deformation that may accompany the bonding action of the pellicle on the mask is minimized.

EMBODIMENT OF THE INVENTION

Next, we will discuss the invention in detail with the attached drawings as a reference.

Figure 1:
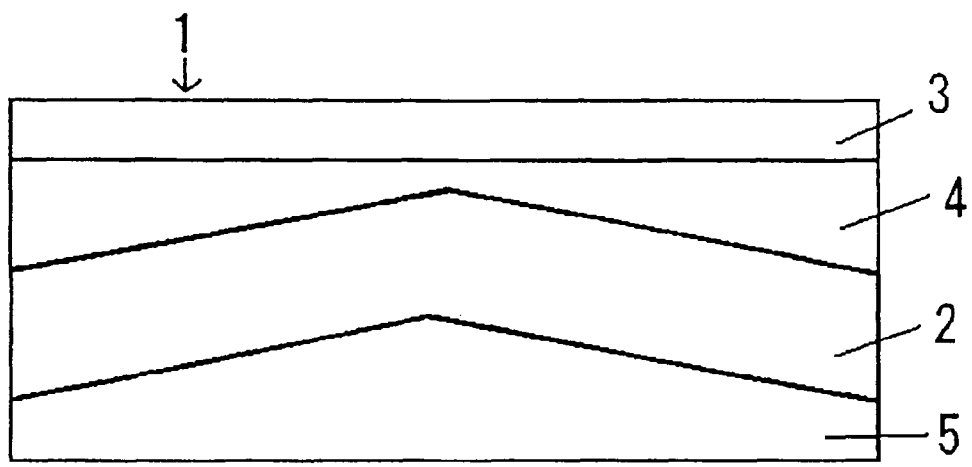
FIG. 1 is a conceptualized side view of a pellicle for lithography according to the present invention.

FIG. 1 is a conceptual side view of a pellicle 1 for lithography embodying the invention, wherein a pellicle membrane 3 is bonded on one of the frame faces of the pellicle frame 2 with an adhesive 4 in-between, and an agglutinant layer 5 for bonding with a mask is laid on the other frame face. Normally a separator is applied over the exposed face of the agglutinant layer 5, but it is not shown in the drawings.

The fact that the pellicle frame is never without any deformation is indicated by means of the exaggerated bent profile of the frame wherein the membrane-bearing frame face is convex and the mask-side frame face is concave. However, this is not to be understood that the deformation of the frame always takes this convex-concave situation.

The agglutinant layer 5 is formed in a manner as described in Publication-in-patent 5 so that the flatness of the exposed face thereof becomes 15 micrometers or smaller. Likewise, the tentative flatness of the surface of the adhesive layer 4 on which a pellicle membrane 3 is to be pasted is desirably 15 micrometers or smaller and preferably 10 micrometers or smaller.

If the flatness of the surface of the plate on which the pellicle membrane is molded is prepared reasonably high, the surface of the pellicle membrane as of the time the membrane is adhered to the adhesive layer 4 can be as flat as the surface of the adhesive layer 4.

An adhesive is applied to the frame face opposite to the frame face bearing the agglutinant layer by any of the conventional methods. After this application, the adhesive is brought in contact with a highly flat surface for flattening, and is hardened. After this hardening, the frame is removed from the highly flat surface, whereat the flatness of the adhesive layer 4 is 10 micrometers or smaller. Thereafter, a pellicle membrane is adhered to the highly flattened adhesive surface by any of conventional methods.

Figure 2:
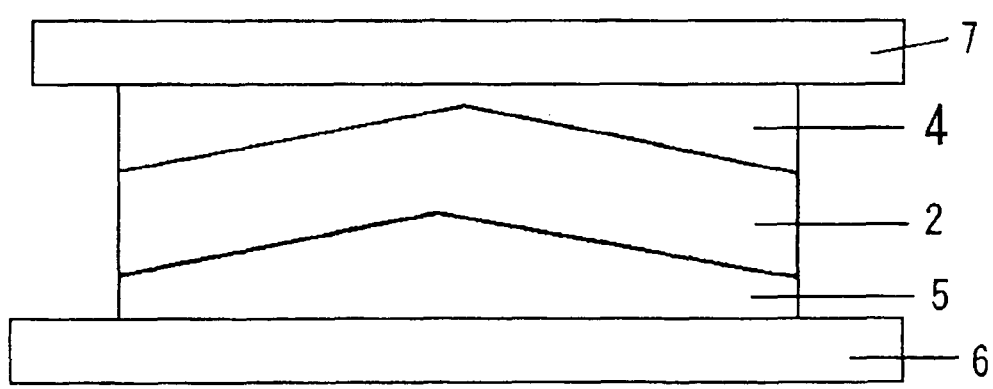
FIG. 2 is a conceptualized side view of a pellicle for lithography as it is placed on a mask under a pressure plate.

With the thus prepared pellicle 1 for lithography, according to the present invention, the adhesive layer 4 bearing the pellicle membrane 3 and the agglutinant layer 5 have highly flat external surfaces, as shown in FIG. 2, so that, when the pellicle is pressed under the pressure plate 7 of a pellicle mounter during the step in which the pellicle 1 is affixed to the mask 6, there is obtained an even distribution of the pressure across the contact area between the mask 6 and the pellicle 1 for lithography, and hence there occurs little bulging of the side faces of the agglutinant layer 5 and little building up of an internal compressive residual stress in the agglutinant layer 5, with a result that the mask scarcely undergoes deformation.

Incidentally, in FIG. 2, the pellicle membrane 3 is not shown.

Embodiment of the Invention

EXAMPLE

A pellicle frame was machined out of an aluminum alloy to have an outer dimension of 149 mm×113 mm, the frame bar cross section being 4.5 mm high and 2 mm wide. Both of the frame faces were each made to have a flatness of 15 micrometers. The frame was washed in pure water. A silicone resin adhesive, X-40-3122A, manufactured by Shin-Etsu Chemical Co., Ltd. was applied, as the mask-bonding agglutinant, to one of the frame faces; then the pellicle frame was left unattended for one hour at the room temperature. After this, the pellicle frame was placed on a separator laid on a 3-micrometer flat surface of a quartz glass plate with the silicone resin agglutinant layer resting on the separator. On this occasion, the agglutinant layer was molded by the separator to have a flatter surface. Thereafter, the quartz glass plate was heated to 60 degrees centigrade whereby the agglutinant was made harder. After this hardening, the pellicle frame together with the separator was removed from the quartz glass plate.

In the next step, the opposite frame face of the frame was coated with a 6-percent concentration fluorine-containing resin solution prepared by dissolving a fluorine resin (CITOP CTX-S, a commercial product manufactured by ASAHI GLASS CO., LTD.) in a fluorine-containing solvent (NOVEC 7300, a commercial product manufactured by Sumitomo 3M Limited); then, the pellicle frame was heated at 130 degrees centigrade to thereby evaporate the solvent and attain a formation of a hardened adhesive layer. Subsequently, a 3-micrometer flat surface of a quartz glass plate was brought in contact with the adhesive layer and the quartz glass plate was heated at 100 degrees centigrade for ten minutes. The quartz glass plate and the adhesive layer were cooled to the room temperature and then the quartz glass plate was carefully detached to leave a membrane-bonding adhesive layer having a highly flattened surface.

Thereafter, onto a pellicle membrane, which was supported by a temporary frame having a greater expanse than the pellicle frame by being bonded thereto, the pellicle frame was bonded by its membrane-receiving frame face, and subsequently the membrane-bonding adhesive layer was heated to fix the pellicle membrane to the membrane-bonding adhesive layer; thereafter, that portions of the pellicle membrane which extended beyond the outer edges of the pellicle frame were removed and a pellicle is completed.

The flatness of this pellicle was measured with a laser beam displacement sensor having an X-Y stage. The flatness of the pellicle on the membrane side was 8 micrometers and the flatness thereof on the opposite side was 15 micrometers. When the pellicle was bonded to a 0.25-micrometer flat surface of a mask, the flatness of the mask was altered to 0.26 micrometer. Thus, the alteration amount was 0.01 micrometer, and this was a value acceptably small.

COMPARATIVE EXAMPLE

A pellicle frame was machined out of the same aluminum alloy as in the above-described Example to have an outer dimension of 149 mm×113 mm, the frame bar cross section being 4.5 mm high and 2 mm wide. Both of the frame faces were each made to have a flatness of 15 micrometers. The frame was washed in pure water. A silicone resin adhesive, X-40-3122A, manufactured by Shin-Etsu Chemical Co., Ltd. was applied, as the mask-bonding agglutinant, to one of the frame faces; then the pellicle frame was left unattended for one hour at the room temperature. After this, the pellicle frame was placed on a separator laid on a 3-micrometer flat surface of a quartz glass plate with the silicone resin agglutinant layer resting on the separator. On this occasion, the agglutinant layer was molded by the plate-backed separator to have a flatter surface. Thereafter, the quartz glass plate was heated to 60 degrees centigrade whereby the agglutinant was made harder. After this hardening, the pellicle frame together with the separator was removed from the quartz glass plate.

In the next step, the opposite frame face of the frame was coated with a 6-percent concentration fluorine-containing resin solution prepared by dissolving a fluorine resin (CITOP CTX-S, a commercial product manufactured by ASAHI GLASS CO., LTD.) in a fluorine-containing solvent (NOVEC 7300, a commercial product manufactured by Sumitomo 3M Limited); then, the pellicle frame was heated at 130 degrees centigrade to thereby evaporate the solvent and obtain a formation of a hardened adhesive layer. Thereafter, onto a pellicle membrane, which was supported by a temporary frame having a greater expanse than the pellicle frame by being bonded thereto, the pellicle frame was bonded by its membrane-receiving frame face, and subsequently the membrane-bonding adhesive layer was heated to fix the pellicle membrane to the membrane-bonding adhesive layer; thereafter, that portions of the pellicle membrane which extended beyond the outer edges of the pellicle frame were shorn off and a pellicle is completed.

The flatness of this pellicle was measured with the same laser beam displacement sensor having an X-Y stage. The flatness of the pellicle on the membrane side was 15 micrometers and the flatness thereof on the opposite side was 15 micrometers. When the pellicle was bonded to a 0.25-micrometer flat surface of a mask, the flatness of the mask was altered to 0.30 micrometer. The inventor considered this alteration amount of 0.05 micrometer would be unacceptable in certain cases of lithography using ArF excimer lasers.

EXPLANATION FOR REFERENCE NUMERALS 1. pellicle for lithography
2. pellicle frame
3. pellicle membrane
4. membrane-bonding adhesive layer
5. agglutinant layer
6. mask
7. pressure plate (of a pellicle mounter)

What is claimed is:

1. A pellicle for lithography comprising:
   a pellicle frame having a first frame face, and a second frame face on a side opposite to the first frame face,
   a membrane-bonding adhesive layer attached to the first frame face of the pellicle frame and having a first flattened surface,
   a pellicle membrane bonded on the first flattened surface of the membrane-bonding adhesive layer, and
   an agglutinant layer attached to the second frame face of said pellicle frame and having a second flattened surface,
   wherein a flatness of the first flattened surface of the membrane-bonding adhesive layer positioned on the pellicle frame is 10 micrometers or smaller.

2. A pellicle for lithography according to claim 1, wherein a flatness of the second flattened surface of the agglutinant layer is 15 micrometers or smaller.

3. A pellicle for lithography according to claim 2, wherein the flatness of the second flattened surface of the agglutinant layer is 10 micrometers or smaller.

4. A pellicle for lithography according to claim 1, further comprising a separator attached to the second flattened surface of the agglutinant layer for protecting the agglutinant layer.

* * * * *